US007767384B2

(12) United States Patent
Vermeersch et al.

(10) Patent No.: US 7,767,384 B2
(45) Date of Patent: Aug. 3, 2010

(54) METHOD FOR MAKING A NEGATIVE-WORKING LITHOGRAPHIC PRINTING PLATE PRECURSOR

(75) Inventors: Joan Vermeersch, Deinze (BE); Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 0 days.

(21) Appl. No.: 11/917,800

(22) PCT Filed: Nov. 24, 2005

(86) PCT No.: PCT/EP2005/056194

§ 371 (c)(1), (2), (4) Date: Dec. 17, 2007

(87) PCT Pub. No.: WO2006/133741

PCT Pub. Date: Dec. 21, 2006

(65) Prior Publication Data

US 2008/0199812 A1 Aug. 21, 2008

Related U.S. Application Data

(60) Provisional application No. 60/694,228, filed on Jun. 27, 2005.

(30) Foreign Application Priority Data

Jun. 17, 2005 (EP) .................................. 05105378

(51) Int. Cl.
*G03F 1/00* (2006.01)
*G03F 7/00* (2006.01)

(52) U.S. Cl. .................... 430/302; 101/463.1; 101/453; 101/456; 101/457

(58) Field of Classification Search ............. 430/270.1, 430/302
See application file for complete search history.

(56) References Cited

U.S. PATENT DOCUMENTS

| | | | | |
|---|---|---|---|---|
| 5,948,591 | A * | 9/1999 | Vermeersch et al. | 430/270.1 |
| 6,737,220 | B2 * | 5/2004 | Mori | 430/302 |
| 2003/0113666 | A1 * | 6/2003 | Endo | 430/281.1 |
| 2005/0037287 | A1 * | 2/2005 | Verschueren et al. | 430/302 |

FOREIGN PATENT DOCUMENTS

| | | | |
|---|---|---|---|
| EP | 0 832 739 | A1 | 4/1989 |
| EP | 0 514 145 | A1 | 11/1992 |
| EP | 0 599 510 | A2 | 6/1994 |
| EP | 0 849 090 | A2 | 6/1998 |
| EP | 0 950 517 | A1 | 10/1999 |
| EP | 1 243 413 | A1 | 9/2002 |
| EP | 1 428 676 | A2 | 6/2004 |
| EP | 1 462 252 | A1 | 9/2004 |

OTHER PUBLICATIONS

Official communication issued in the International Application No. PCT/EP2005/056194, mailed on Mar. 2, 2006.

* cited by examiner

*Primary Examiner*—Cynthia H Kelly
*Assistant Examiner*—Chanceity N Robinson
(74) *Attorney, Agent, or Firm*—Keating & Bennett, LLP

(57) ABSTRACT

A method for making a heat-sensitive negative-working lithographic printing plate precursor including the steps of providing a support having a hydrophilic surface or which is provided with a hydrophilic layer, and applying onto the support a coating solution including an infrared absorbing agent, hydrophobic thermoplastic polymer particles, a hydrophilic binder, and a polymer including siloxane and/or perfluoroalkyl monomeric units.

11 Claims, No Drawings

METHOD FOR MAKING A NEGATIVE-WORKING LITHOGRAPHIC PRINTING PLATE PRECURSOR

CROSS-REFERENCE TO RELATED APPLICATIONS

This application is a 371 of PCT/EP2005/056194, filed Nov. 24, 2005. This application claims the benefit of U.S. Provisional Application No. 60/694,228, filed Jun. 27, 2005, which is incorporated herein by reference in its entirety. In addition, this application claims the benefit of European Application No. 05105378.3, filed Jun. 17, 2005, which is also incorporated herein by reference in its entirety.

BACKGROUND OF THE INVENTION

1. Field of the Invention

The present invention relates to a method for making a heat-sensitive, negative-working lithographic printing plate precursor.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional so-called "wet" lithographic printing, ink as well as an aqueous fountain solution (also called dampening liquid) are supplied to the lithographic image which consists of oleophilic (or hydrophobic, i.e., ink-accepting, water-repelling) areas and hydrophilic (or oleophobic, i.e., water-accepting, ink-repelling) areas. In so-called driographic printing, the lithographic image consists of ink-accepting and ink-abhesive (ink-repelling) areas, and during driographic printing only ink is supplied to the master.

Printing masters are generally obtained by the image-wise exposure and processing of an imaging material called a plate precursor. In addition to the well-known photosensitive, so-called pre-sensitized plates, which are suitable for UV contact exposure through a film mask, heat-sensitive printing plate precursors have also become very popular in the late 1990s. Such thermal materials offer the advantage of daylight stability and are especially used in the so-called computer-to-plate method wherein the plate precursor is directly exposed, i.e., without the use of a film mask. The material is exposed to heat or to infrared light and the generated heat triggers a (physico-) chemical process, such as ablation, polymerization, insolubilization by crosslinking of a polymer, heat-induced solubilization, or by particle coagulation of a thermoplastic polymer latex.

Although some of these thermal processes enable plate making without wet processing, the most popular thermal plates form an image by a heat-induced solubility difference in an alkaline developer between exposed and non-exposed areas of the coating. The coating typically includes an oleophilic binder, e.g., a phenolic resin, of which the rate of dissolution in the developer is either reduced (negative working) or increased (positive working), by the image-wise exposure. During processing, the solubility differential leads to the removal of the non-image (non-printing) areas of the coating thereby revealing the hydrophilic support, while the image (printing) areas of the coating remain on the support. Typical examples of such plates are described in, e.g., European Patent Nos. 625728, 823327, 825927, 864420, 894622, and 901902. Negative working embodiments of such thermal materials often require a pre-heat step between exposure and development as described in, e.g., European Patent No. 625728.

Negative working plate precursors which do not require a pre-heat step may contain an image-recording layer that works by heat-induced particle coalescence of a thermoplastic polymer latex, as described in, e.g., European Patent Nos. 770494, 770495, 770496, and 770497. These patents disclose a method for making a lithographic printing plate including the steps of (1) image-wise exposing an imaging element including hydrophobic thermoplastic polymer particles dispersed in a hydrophilic binder and a compound capable of converting light into heat, and (2) developing the image-wise exposed element by applying fountain solution and/or ink.

Another plate that works by latex coalescence is described in European Patent No. 800928, which discloses a heat-sensitive imaging element including on a hydrophilic support an image-recording layer including an infrared absorbing compound and hydrophobic thermoplastic particles dispersed in an alkali soluble or swellable resin which contains phenolic hydroxyl groups.

A similar plate is described in U.S. Pat. No. 6,427,595 which discloses a heat-sensitive imaging element for making lithographic printing plates including, on a hydrophilic surface of a lithographic base, an image-recording layer including a compound capable of converting light into heat and hydrophobic thermoplastic polymer particles, which have a specific particle size and polydispersity, dispersed in a hydrophilic binder.

European Patent Nos. 514145 and 599510 disclose a method for forming images by direct exposure of a radiation sensitive plate including a coating including core-shell particles having a water insoluble heat softenable core compound and a shell compound which is soluble or swellable in an aqueous alkaline medium. Image-wise exposure with infrared light causes the particles to coalesce, at least partially, to form an image, and the non-coalesced particles are then selectively removed by an aqueous alkaline developer. Afterwards, a baking step is performed.

European Patent No. 950517 discloses a lithographic printing plate precursor consisting of a lithographic base with a hydrophilic surface and an IR-sensitive top layer including a polymer soluble in an aqueous alkaline solution and a polysiloxane surfactant.

European Patent No. 1,462,252 discloses a positive-working heat-sensitive printing plate precursor including, on a support having a hydrophilic surface, a coating including a cross-linked polysiloxane spacer particle with a particle size between 1 μm and 15 μm, an infrared absorbing agent, an oleophilic resin soluble in an aqueous alkaline solution, and a developer resistance means.

European Patent No. 1,243,413 discloses a method for making a negative-working heat-sensitive lithographic printing plate precursor including the steps of (i) applying on a lithographic base having a hydrophilic surface an aqueous dispersion including hydrophobic thermoplastic particles and particles of a polymer B which have a softening point lower than the glass transition temperature of the hydrophobic thermoplastic particles, and (ii) heating the image-recording layer at a temperature which is higher than the softening point of polymer B and lower than the glass temperature of the hydrophobic thermoplastic particles.

U.S. Pat. No. 5,948,591 discloses a heat sensitive element for making a lithographic printing plate including, on a base having a hydrophilic surface, an image-recording layer including an infrared absorbing agent, hydrophobic thermoplastic particles, and a copolymer containing acetal groups and hydroxyl groups which are at least partially reacted with a compound with at least two carboxyl groups.

European Patent No. 832,739 discloses a heat-sensitive element including, on a support having an ink-accepting surface, an image-forming layer containing hydrophobic thermoplastic polymer particles and a compound capable of converting light into heat, and a cured ink-repellent surface layer.

U.S. Pat. No. 6,737,220 discloses a printing plate precursor including a support onto which a coating liquid containing thermoplastic particles and a water-soluble material such as a saccharide is applied, wherein the coating liquid may include a water-soluble silicon or fluorine containing surfactant to improve its coatability.

European Patent No. 849090 discloses an imaging element for making a lithographic printing plate including on a flexible support (i) an ink-repellent layer including a cross-linked hydrophilic binder, (ii) a thermo-sensitive layer including hydrophobic thermoplastic particles dispersed in a hydrophilic binder, and (iii) an outermost layer on top of the layers including a solid or liquid lubricant in a hydrophilic binder.

European Patent No. 1,428,676 discloses a printing material including on an aluminum support an image forming layer including thermoplastic particles and a light-to-heat conversion dye, wherein the imaging forming layer may further include a water-soluble resin and/or a water-soluble silicon or fluorine atom-containing surfactant.

Printing plate precursors are susceptible to damage caused by mechanical forces applied to the surface of the coating during automatic transport, mechanical handling, and/or manual handling. The risk of damage occurs especially before and after the imaging step prior to the processing step. In a typical platesetter, the plate precursors are conveyed by a mechanical device, e.g., rollers or suction cups/devices which are applied to the surface of the precursors and thereby may cause damage to the coating. Rollers may, for example, cause latex particles to partially coalesce thereby forming ink-accepting areas at non-image areas, while suction cups may destroy the coating resulting in disturbed image areas. Furthermore, after coating and drying, the thermal printing plates are stacked and are then, by means of specified packaging equipment, cut and packed in boxes. During cutting and packing of the printing plate precursors as well as during transport of the packed printing plate precursors, the plates can move relative to each other whereby the heat-sensitive coating is rubbed which also may result in surface damage. Moreover, the manual handling of the printing plate precursors may result in so-called fingerprints which lead to a reduced printing quality.

Thus, the major problems associated with the prior art plate materials that work by latex coalescence is that they are easily damaged by automatic plate handling systems and/or by mechanical and manual contact, wherein this damage results in a reduced printing quality due to a destruction of the surface of the coating of the printing plate precursor or to a pressure-induced coalescence of the latex particles in the image recording layer.

SUMMARY OF THE INVENTION

In order to overcome the problems described above, preferred embodiments of the present invention provide a method for making a negative-working, heat-sensitive lithographic printing plate precursor based on latex coalescence with improved handling characteristics, i.e., a printing plate precursor which is less sensitive to damage by pressure, abrasion, fingerprints, or suction cups.

This advantage is achieved by a method for making a heat-sensitive negative-working lithographic printing plate precursor including the steps of providing a support having a hydrophilic surface or which is provided with a hydrophilic layer, applying onto the support a coating solution including an infrared absorbing agent, hydrophobic thermoplastic polymer particles, a hydrophilic binder, and a polymer including siloxane and/or perfluoroalkyl monomeric units.

It was discovered that the presence of the polymer including siloxane and/or perfluoroalkyl monomeric units in the coating reduces the sensitivity of the coating to damage.

Other features, elements, processes, steps, characteristics and advantages of the present invention will become more apparent from the following detailed description of preferred embodiments of the present invention.

DETAILED DESCRIPTION OF PREFERRED EMBODIMENTS

The coating solution that is used in a preferred embodiment of the method of the present invention includes a polymer including siloxane and/or perfluoroalkyl monomeric units. These polymers are typically water-repellent and are preferably present in the coating in an amount between 0.5 mg/m$^2$ and 60 mg/m$^2$, more preferably between 0.5 mg/m$^2$ and 45 mg/m$^2$, and most preferably between 0.5 mg/m$^2$ and 30 mg/m$^2$, for example. Addition of higher amounts may result in a too high resistance towards an aqueous developer. The polymer including siloxane and/or perfluoroalkyl monomeric units may be a linear, cyclic, or complex cross-linked polymer or copolymer. The polymer including siloxane monomeric units, hereinafter also referred to as polysiloxane, includes any polymer that contains more than one siloxane unit or group —Si(R,R')—O—, wherein R and R' are optionally substituted alkyl or aryl groups. Preferred siloxanes are phenylalkylsiloxanes and dialkylsiloxanes. The polymer including perfluoroalkyl monomeric units includes any polymer that contains more than one perfluoroalkyl unit $—(CF_2)—$. The number of perfluoroalkyl or siloxane monomeric units in the polymer is at least 2, preferably at least 10, and more preferably at least 20, for example. It may be less than 100, preferably less than 60, for example.

In a preferred embodiment, the polymer including siloxane and/or perfluoroalkyl monomeric units is a block-copolymer or a graft-copolymer including a poly- or (oligo)alkylene oxide block and a block including siloxane and/or perfluoroalkyl monomeric units. The block including the siloxane and/or perfluoroalkyl monomeric units may be a linear, branched, cyclic, or complex cross-linked polymer or copolymer.

The perfluoroalkyl unit and the polysiloxane unit of the block-copolymer or graft-copolymer are preferably as described above.

The alkylene block preferably includes units of the formula $—C_nH_{2n}—O—$ wherein n is preferably an integer in the range 2 to 5. The moiety $—C_nH_{2n}—$ may include straight or branched chains. The alkylene moiety may also include optional substituents.

A suitable polysiloxane is preferably a random or block-copolymer including siloxane and alkyleneoxide groups, suitably including about 15 to 25 siloxane units and 50 to 70 alkyleneoxide groups, for example. Preferred embodiments and explicit examples of such polymers are disclosed in WO99/21725. Preferred examples include copolymers including phenylmethylsiloxane and/or dimethylsiloxane as well as ethylene oxide and/or propylene oxide, which are commercially available.

The polymer including siloxane and/or perfluoroalkyl monomeric units is present in the layer including the hydrophobic thermoplastic particles and the hydrophilic binder, i.e., the imaging layer. According to a preferred method of the present invention, a coating solution including an infrared absorbing agent, the polymer including siloxane and/or perfluoroalkyl monomeric units, hydrophobic thermoplastic particles, and a hydrophilic binder is applied onto a support having a hydrophilic surface or which is provided with a hydrophilic layer.

The hydrophobic thermoplastic particles present in the coating preferably have an average particle size between 15 nm and 150 nm, more preferably between 45 nm and 100 nm, even more preferably between 45 nm and 80 nm, and most preferably between 48 nm and 58 nm, for example.

The amount of hydrophobic thermoplastic polymer particles present in the coating is preferably at least 70% by weight, more preferably at least 75% by weight, and most preferably at least 80% by weight, for example. Alternatively, the amount of hydrophobic thermoplastic polymer particles in the coating is preferably between 70% by weight and 84% by weight, more preferably between 75% by weight and 84% by weight, for example. The weight percentage of the hydrophobic thermoplastic polymer particles is determined relative to all the components of the coating.

The hydrophobic thermoplastic polymer particles are preferably selected from polyethylene, poly(vinyl)chloride, polymethyl(meth)acrylate, polyethyl (meth)acrylate, poyvinylidene chloride, poly(meth)acrylonitrile, polyvinylcarbazole, polystyrene, or copolymers thereof. According to a preferred embodiment, the thermoplastic polymer particles include polystyrene or derivatives thereof, mixtures including polystyrene and poly(meth)acrylonitrile or derivatives thereof, or copolymers including polystyrene and poly(meth)acrylonitrile or derivatives thereof. The latter copolymers may include at least 50% by weight of polystyrene, more preferably at least 65% by weight of polystyrene. In order to obtain sufficient resistivity towards organic chemicals such as hydrocarbons used in plate cleaners, the thermoplastic polymer particles preferably include at least 0.1% by weight of nitrogen as described in European Patent No. 1,219,416. A preferred example is (meth)acrylonitrile. According to another preferred embodiment, the thermoplastic polymer particles consist essentially of styrene and acrylonitrile units in a weight ratio between 1:1 and 5:1 (styrene:acrylonitrile), e.g., in a 2:1 ratio.

The weight average molecular weight of the thermoplastic polymer particles may range from 5,000 g/mol to 1,000,000 g/mol.

The hydrophobic thermoplastic polymer particles present in the coating can be applied onto the lithographic base in the form of a dispersion in an aqueous coating liquid and may be prepared by the methods disclosed in U.S. Pat. No. 3,476,937 or European Patent No. 1,217,010. Another preferred method especially suitable for preparing an aqueous dispersion of the thermoplastic polymer particles includes dissolving the hydrophobic thermoplastic polymer in an organic water immiscible solvent, dispersing the thus obtained solution in water or in an aqueous medium, and removing the organic solvent by evaporation.

The coating further includes a hydrophilic binder which is preferably soluble in an aqueous developer. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate, and maleic anhydride/vinylmethylether copolymers.

In a preferred embodiment of the present invention, the coating further includes spacer particles. The spacer particles may be inorganic or organic particles.

Inorganic spacer particles include for example silicon-, titanium-, aluminum-, zinc-, iron-, chromium- or zirconium containing particles, metal oxides or hydroxides thereof, aluminumsilicates, and metal salts such as calcium carbonate, barium sulfate, barium titanate, and strontium titanate.

Examples of organic spacer particles include optionally cross-linked polyalkyl(meth)acrylate such as polymethylmethacrylate, polystyrene, melamine, polyolefins such as polyethylene or polypropylene, halogenated polyolefins such as fluorinated polyolefins for example polytetrafluoroethylene, silicones such as cross-linked polysiloxane particles, or copolymers thereof. Examples of polysiloxane particles include cross-linked polyalkylsiloxanes such as polymethylsiloxane. Commercially available cross-linked polysiloxane particles are for example Tospearl from TOSHIBA SILICONE Co., Ltd.

The spacer particles preferably have a particle size larger than 0.5 μm, more preferably a particle size larger than 0.8 μm, and most preferably equal to or larger than 1.0 μm, for example. The particle size is preferably included between 0.5 μm and 15 μm, more preferably between 0.5 μm and 7 μm, and most preferably between 0.8 μm and 5 μm, for example. The particle size refers to the average particle size and may be measured by a laser diffraction particle analyzer such as the Coulter LS Particle Size Analyzer, e.g., the Coulter LS-230, commercially available by Beckman Coulter Inc. The average particle size is defined as the mean or median of the volume distribution of particle size.

By adding the spacer particles to the coating, the resistance of the coating against manual or mechanical damage is further improved. For obtaining a significant effect, the spacer particles preferably have a diameter which is greater than the thickness of the coating. The coating preferably has a layer thickness greater than 0.5 μm, more preferably the layer thickness is included between 0.6 μm and 2.8 μm, for example. The particle size of the spacer particles is preferably included between one to two times the thickness of the coating.

According to a preferred embodiment of the present invention, the amount of the particles in the coating layer is preferably included between 8 $mg/m^2$ and 200 $mg/m^2$, more preferably between 10 $mg/m^2$ and 150 $mg/m^2$, and most preferably between 20 $mg/m^2$ and 100 $mg/m^2$, for example.

When the coating includes more than one distinct layer, at least one of these layers may include the spacer particles. The spacer particles may be present in the imaging layer and/or in an optional other layer.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate including an aluminum foil and a plastic layer, e.g., polyester film.

A particularly preferred lithographic support is an electrochemically grained and anodized aluminum support. The aluminum is preferably grained by electrochemical graining, and anodized by anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained.

By anodizing the aluminum support, its abrasion resistance and hydrophilic nature are improved. The microstructure as well as the thickness of the $Al_2O_3$ layer are determined by the anodizing step, the anodic weight (g/m$^2$ of $Al_2O_3$ formed on the aluminum surface) varies between 1 g/m$^2$ and 8 g/m$^2$.

The grained and anodized aluminum support may be post-treated to improve the hydrophilic properties of its surface. For example, the aluminum oxide surface may be silicated by treating its surface with a sodium silicate solution at an elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g., carboxylic acids, hydrocarboxylic acids, sulphonic acids or phosphoric acids, or their salts, e.g., succinates, phosphates, phosphonates, sulphates, and sulphonates. A citric acid or citrate solution is preferred. This treatment may be carried out at room temperature or may be carried out at a slightly elevated temperature of about 30° C. to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1,084,070; DE 4,423,140; DE 4,417,907; EP 659909; EP 537633; DE 4,001,466; EP A 292801; EP A 291760; and U.S. Pat. No. 4,458,005.

According to another preferred embodiment, the support can also be a flexible support, which is provided with a hydrophilic layer, hereinafter called 'base layer'. The flexible support is, e.g., paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate, or a hydrolyzed tetra-alkylorthosilicate. The latter is particularly preferred. The thickness of the hydrophilic base layer may vary in the range of 0.2 μm to 25 μm and is preferably 1 μm to 10 μm. Particular examples of suitable hydrophilic base layers for use in accordance with preferred embodiments of the present invention are disclosed in EP 601240; GB 1419512; FR 2300354; U.S. Pat. No. 3,971,660; and U.S. Pat. No. 4,284,705.

An optimal ratio between pore diameter of the surface of the aluminum support (if present) and the average particle size of the hydrophobic thermoplastic particles may enhance the press life of the printing plate and may improve the toning behavior of the prints. This ratio of the average pore diameter of the surface of the aluminum support to the average particle size of the thermoplastic particles present in the image-recording layer of the coating, preferably ranges from 0.05:1 to 0.8:1, more preferably from 0.10:1 to 0.35:1.

The coating further contains a compound which absorbs infrared light and converts the absorbed energy into heat. The amount of infrared absorbing agent in the coating is preferably between 0.25% and 25.0% by weight, more preferably between 0.5% and 20.0% by weight. In a preferred embodiment, its concentration is at least 4% by weight, more preferred at least 6% by weight. When the coating includes more than one distinct layer, at least one of these layers may include the infrared absorbing agent. The infrared absorbing agent is preferably present in the imaging layer and/or in an optional other layer. Preferred IR absorbing agents are dyes such as cyanine, merocyanine, indoaniline, oxonol, pyrilium and squarilium dyes or pigments such as carbon black. Examples of suitable IR absorbers are described in e.g. EP-A 823327; EP-A 978376; EP-A 1,029,667; EP-A 1,053,868; EP-A 1,093,934; WO 97/39894; and WO 00/29214. A preferred compound is the following cyanine dye IR-1:

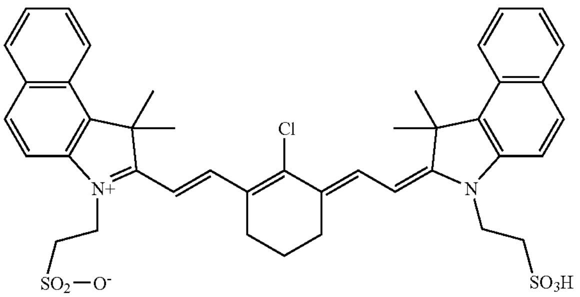

To further protect the surface of the coating a protective layer may also optionally be applied. The protective layer generally includes at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e., less than 5% by weight, based on the total weight of the coating.

The coating may in addition to the layers already discussed above further include, for example, an adhesion-improving layer between the coating and the support.

Optionally, the coating may further contain additional ingredients such as, for example, additional binders or colorants. Especially addition of colorants such as dyes or pigments which provide a visible color to the coating and remain in the exposed areas of the coating after the processing step, are advantageous. Thus, the image-areas which are not removed during the processing step form a visible image on the printing plate and examination of the developed printing plate already at this stage becomes feasible. Typical examples of such contrast dyes are the amino-substituted tri- or diarylmethane dyes, e.g., crystal violet, methyl violet, victoria pure blue, flexoblau 630, basonylblau 640, auramine, and malachite green. Also the dyes which are discussed in depth in the detailed description of EP-A 400706 are suitable contrast dyes. Dyes which, combined with specific additives, only slightly color the coating but which become intensively colored after exposure, are also of interest. If the coating includes more than one layer, these colorants may be present in the image-recording layer and/or in on optional other layer.

The printing plate precursor according to a preferred method of the present invention can be image-wise exposed by infrared light, preferably near infrared light. The infrared light is preferably converted into heat by an IR light absorbing compound as discussed above. The heat-sensitive lithographic printing plate precursor is preferably not sensitive to visible light. Most preferably, the coating is not sensitive to ambient daylight, i.e., visible (400-750 nm) and near UV light (300-400 nm) at an intensity and exposure time corresponding to normal working conditions so that the material can be handled without the need for a safe light environment.

The printing plate precursor can be exposed to infrared light by, e.g., LEDs or an infrared laser. Preferably, the light used for the exposure is a laser emitting near infrared light having a wavelength in the range from about 700 to about 1500 nm, e.g., a semiconductor laser diode, a Nd:YAG, or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e., the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters for thermal plates having a typical laser power from about 20 mW to about 500 mW operate at a lower scan speed, e.g., from 0.1 to 20 m/sec. The Creo Trendsetter plate-setter family (trademark of Creo) and the Agfa Xcalibur plate-setter family (trademark of Agfa Gevaert N.V.) both make use of the XTD-technology.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening, or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

After exposure, the material can be developed by supplying to the coating an aqueous alkaline solution and/or a gum solution and/or by rinsing it with plain water or an aqueous liquid, whereby the non-image areas of the coating are removed. The developing step may be combined with mechanical rubbing, e.g., by a rotating brush. During the development step, any water-soluble protective layer present is preferably also removed.

Alternatively, the printing plate precursor can, after exposure, be mounted on a printing press and be developed on-press by supplying ink and/or fountain solution to the precursor.

The gum solution which can be used in the development step is typically an aqueous liquid which includes one or more surface protective compounds that are capable of protecting the lithographic image of a printing plate against contamination or damage. Suitable examples of such compounds are film-forming hydrophilic polymers or surfactants. The gum solution preferably has a pH from 3 to 8, more preferably from 5 to 8. Preferred gum solutions are described in EP 1,342,568.

A preferred aqueous alkaline developer solution is a developer with a pH of at least 10, more preferably at least 11, and most preferably at least 12. Preferred developer solutions are buffer solutions such as for example silicate-based developers or developer solutions including phosphate buffers. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution including sodium or potassium metasilicate, i.e., a silicate where the ratio of silicon dioxide to alkali metal oxide is 1.

In addition to alkali metal silicates, the aqueous alkaline developer may optionally contain further components, such as buffer substances, complexing agents, antifoams, organic solvents in small amounts, corrosion inhibitors, dyes, surfactants and/or hydrotropic agents as known in the art.

The development step with an aqueous alkaline solution is preferably carried out at temperatures of from 20° C. to 40° C. in automated processing units as customary in the art. For regeneration, alkali metal silicate solutions having alkali metal contents of from 0.6 mol/l to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 ml to 50 ml per square meter of plate precursor. The addition of replenisher can be regulated, for example, by measuring the conductivity of the developer as described in EP-A 556690.

The development step with an aqueous alkaline solution may be followed by a rinsing step and/or a gumming step. The gumming step involves post-treatment of the lithographic printing plate with a gum solution (as described above).

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the thermoplastic particles, e.g., between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes, or at a temperature of 120° C. for 30 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink includes an ink phase, also called the hydrophobic or oleophilic phase, and a polyol phase as described in WO 00/32705.

EXAMPLES

Example 1

Preparation of the Lithographic Substrate

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained during 15 seconds using an alternating current in an aqueous solution containing 12 g/l of hydrochloric acid and 38 g/l of aluminum sulfate (18-hydrate) at a temperature of 33° C. and a current density of 130 $A/dm^2$. After rinsing with demineralized water for 2 seconds, the aluminum foil was then desmutted by etching with an aqueous solution containing 155 g/l of sulfuric acid at 70° C. for 4 seconds and rinsed with demineralized water at 25° C. for 2 seconds. The foil was subsequently subjected to anodic oxidation during 13 seconds in an aqueous solution containing 155 g/l of sulfuric acid at a temperature of 45° C. and a current density of 22 $A/dm^2$, then washed with demineralized water for 2 seconds and post-treated for 10 seconds with a solution containing 4 g/l of polyvinylphosphonic acid at 40° C., rinsed with demineralized water at 20° C. during 2 seconds and dried.

The support thus obtained has a surface roughness Ra of 0.21 μm and an anodic weight of 4 $g/m^2$ of $Al_2O_3$.

Preparation of the Printing Plate Precursors 1-7

Preparation of Comparative Printing Plate Precursor 1

Comparative printing plate precursor 1 was produced by first applying a coating solution onto the above described lithographic substrate. The composition of the coating is defined in Table 1. The coating was applied from an aqueous coating solution and dried at 60° C.; a dry coating weight of 0.8 $g/m^2$ was obtained.

TABLE 1

Composition of the Dry Coating (% wt)

| INGREDIENTS | % wt |
|---|---|
| Styrene/acrylonitrile copolymer (1) | 83 |
| Triethylammonium salt of IR-1 (2) | 8 |
| Polyacrylic acid binder (3) | 6 |
| Cab O Jet 250(4) | 3 |

(1) weight ratio 60/40, stabilized with an anionic wetting agent; average particle size 52 nm, measured with a Brookhaven BI-90 analyser, commercially available from Brookhaven Instrument Company, Holtsville, NY, USA;
(2) Infrared absorbing as defined above;
(3) Aquatreat AR-7H from National Starch & chemical company, Mw = 500 000 g/mol;
(4) Copper phtalocyanine dispersion in water from Cabot.

Preparation of Invention Printing Plate Precursors 2 to 7

Printing plate precursors 2 to 7 were prepared by applying the coating solution of Table 1 to which a polymer including siloxane monomeric units was added to improve the sensitivity to suction cups as used in automatic plate handling (Table 2).

TABLE 2

Properties and Quantity of the Siloxane-Containing Polymer

| | Polymer type | Amount $mg/m^2$ |
|---|---|---|
| Printing Plate Percursor 2 | (1) | 7 |
| Printing Plate Percursor 3 | (1) | 21 |
| Printing Plate Percursor 4 | (2) | 7 |
| Printing Plate Percursor 5 | (2) | 21 |
| Printing Plate Percursor 6 | (3) | 7 |
| Printing Plate Percursor 7 | (3) | 21 |

(1) Silwet L7607 is a copolymer of polysiloxane and polyether, commercially available from OSI Specialities Benelux.
(2) Tegoglide 440 is a copolymer of polysiloxane and polyether, commercially available from Goldschmidt.
(3) Adilonix AGSVA, copolymer of polysiloxane and polyether, commercially available from. DistriChem BV.

Determination of the Sensitivity to Suction Cups of the Printing Plate Precursors 1-7

A simulation test as described in detail below was performed to assess the sensitivity to suction cups as used in automatic plate handling.

Procedure of the Simulation Test

A series of suction cups are contacted to the plate under a reduced pressure of 85 kPa. The contact time is varied: four cups are contacted for respectively 30, 60, 180, and 300 seconds. After processing and printing (printing conditions see below) the damage for all pressures on plate and/or print is integrated and compared to the reference precursor.

Exposure Step

After the above test, the plate precursors 1-7 were exposed with a Creo Trendsetter 2344T (40 W) (plate-setter, trademark from Creo, Burnaby, Canada), operating at 150 rpm and a varying density up to 210 $mJ/cm^2$.

Processing and Gumming Step

After exposure, the plate precursors were processed in an Agfa VA88 processor (trademark from Agfa-Gevaert), operating at a speed of 1.1 m/min and at 22° C., using Agfa PD91 (see below) as developer solution (trademark from Agfa-Gevaert).

Agfa PD91 is a buffer solution including potassium metasilicate, Genapol C200 (surfactant commercially available from Clariant GmbH, Frankfurt am Main, Germany) and Librateric AA30 (surfactant commercially available from Libra Chemicals Limited, Manchester UK) and has a pH=13.

After development, the plates are gummed with RC795 (trademark from Agfa-Gevaert).

Printing Step

The plates were mounted on a GT046 printing press (available from Heidelberger Druckmaschinen AG), and a print job was started using K+E Novavit 800 Skinnex ink (trademark of BASF Drucksysteme GmbH) and 3% FS101 (trademark of Agfa-Gevaert) in 10% isopropanol as a fountain liquid.

Print Results

The results of the simulation test to assess the sensitivity to suction cups were determined and are summarized in Table 3.

TABLE 3

| Results of the Simulation Tests. | | |
|---|---|---|
| | Simulation test suction cups on plate | Simulation test suction cups on print |
| Plate 1 (Precursor 1) Comparative Example | -- | - |
| Plate 2 (Precursor 2) Invention Example | - | + |
| Plate 3 (Precursor 3) Invention Example. | - | + |
| Plate 4 (Precursor 4) Invention Example | - | + |
| Plate 5 (Precursor 5) Invention Example | - | ++ |
| Plate 6 (Precursor 6) Invention Example | - | + |
| Plate 7 (Precursor 7) Invention Example | - | ++ |

++ indicates no damage;
+ indicates slight damage (commercially acceptable);
- indicates moderate damage (commercially unacceptable);
-- indicates severe damage.

The results in Table 3 demonstrate that the sensitivity to suction cups as used in automatic plate handling on print is improved by adding a copolymer including siloxane units. A concentration of 7 mg/m$^2$ is sufficient while an amount of 21 mg/m$^2$ is even better.

The sensitivity to finger prints upon manual handling was also assessed and the printing plates including the copolymer including siloxane units showed a decreased sensitivity to finger prints upon manual handling. A concentration of 7 mg/m$^2$ is sufficient while a level of 21 mg/m$^2$ is preferred.

Example 2

Preparation of the Lithographic Substrate

The preparation of the lithographic substrate was done as described in Example 1.

Preparation of the Printing Plate Precursors 8-11

Preparation of Comparative Printing Plate Precursor 8

Comparative printing plate precursor 8 was produced by first applying a coating solution onto the above described lithographic substrate. The composition of the coating is defined in Table 4. The coating was applied from an aqueous coating solution and dried for 1 minute at 50° C.; a dry coating weight of 0.69 g/m$^2$ was obtained.

TABLE 4

| Composition of the Dry Coating. | |
|---|---|
| INGREDIENTS | % wt |
| Styrene/acrylonitrile copolymer (1) | 83 |
| Triethylammonium salt of IR-1 (2) | 8 |
| Polyacrylic acid binder (3) | 6 |
| Cab O Jet 250 (4) | 3 |

(1) weight ratio 66/33, stabilized with an anionic wetting agent; average particle size 55 nm, measured with a Brookhaven BI-90 analyser, commercially available from Brookhaven Instrument Company, Holtsville, NY, USA;
(2) Infrared absorbing dye as defined above;
(3) Aquatreat AR-7H from National Starch & chemical company, Mw = 500.000 g/mol;
(4) Copper phtalocyanine dispersion in water from Cabot.

Preparation of Invention Printing Plate Precursors 9 to 11

Printing plate precursors 9 to 11 were prepared by applying the coating solution of Table 4 to which one or more additional ingredients were added as indicated in the Table 5 below (Table 5).

TABLE 5

| Additional Ingredients | | |
|---|---|---|
| | Polymer particle (1) mg/m$^2$ | Tegoglide 440 (2) mg/m$^2$ |
| Printing plate precursor 9 | 25 | — |
| Printing plate precursor 10 | — | 23 |
| Printing plate precursor 11 | 25 | 23 |

(1) Polymethylmethacrylate, having an average particle size of 1 μm, commercially available from SOKEM CHEM;
(2) Tegoglide 440 is a copolymer of polysiloxane and polyether, commercially available from Goldschmidt.

Determination of the Sensitivity to Suction Cups of the Printing Plate Precursors 8-11

The simulation test as described in detail in Example 1 was performed to assess the sensitivity to suction cups as used during automatic plate handling.

Exposure Step

The plate precursors 8-11 were exposed with a Creo Trendsetter 2344T (40 W) (plate-setter, trademark from Creo, Burnaby, Canada), operating at a varying density up to 210 mJ/cm$^2$.

Processing and Gumming Step

After exposure, the plate precursors were processed in an Agfa VA88 processor (trademark from Agfa), operating at a speed of 1.1 m/min and at 22° C., using Agfa PD91 (see below) as developer solution (trademark from Agfa).

Agfa PD91 is a buffer solution including potassium metasilicate, Genapol C200 (surfactant commercially available from Clariant GmbH, Frankfurt am Main, Germany) and Librateric AA30 (surfactant commercially available from Libra Chemicals Limited, Manchester UK) and has a pH=13.

After development, the plates are gummed with RC795 (trademark from Agfa).

Printing Step

The plates were mounted on a GT052 printing press (available from Heidelberger Druckmaschinen AG), and a print job was started using K+E Novavit 800 Skinnex ink (trademark of BASF Drucksysteme GmbH) and 3% FS101 (trademark of Agfa) in 10% isopropanol as a fountain liquid.

Print Results

The results of the simulation test to assess the sensitivity to suction cups as used during automatic plate handling were determined and are summarized in Table 6.

TABLE 6

Results of the Simulation Tests.

| | Simulation test suction cups on plate | Simulation test suction cups on print |
|---|---|---|
| Plate 8 (Precursor 8) Comparative Example | -- | - |
| Plate 9 (Precursor 9) Comparative Example | + | - |
| Plate 10 (Precursor 10) Invention Example. | ++ | + |
| Plate 11 (Precursor 12) Invention Example | ++ | ++ |

++ indicates no damage;
+ indicates slight damage (commercially acceptable);
- indicates moderate damage (commercially unacceptable);
-- indicates severe damage.

The results in Table 6 demonstrate that the invention printing plates 10 and 11 which include polysiloxanes, are less sensitive to suction cups as used in automatic plate handling on plate/print compared to the comparative printing plates 8 and 9. The result of printing plate 11 which further includes a spacer particle, is even better.

While preferred embodiments of the present invention have been described above, it is to be understood that variations and modifications will be apparent to those skilled in the art without departing the scope and spirit of the present invention. The scope of the present invention, therefore, is to be determined solely by the following claim.

The invention claimed is:

1. A method for making a heat-sensitive negative-working lithographic printing plate precursor comprising the steps of:

providing a support having a hydrophilic surface or which is provided with a hydrophilic layer; and applying onto the support a coating including an infrared absorbing agent, hydrophobic thermoplastic polymer particles, a hydrophilic binder, and a polymer having siloxane and/or perfluoroalkyl monomeric units; wherein the polymer is a block-copolymer or graft-copolymer including a poly- or oligo(alkylene oxide) block and a block including siloxane and/or perfluoroalkyl monomeric units.

2. A method according to claim 1, wherein the amount of the polymer in the coating is between 0.5 $mg/m^2$ and 60 $mg/m^2$.

3. A method according to claim 1, wherein the hydrophobic thermoplastic polymer particles have an average particle size in the range from 15 nm to 150 nm.

4. A method according to claim 1, wherein the amount of the hydrophobic thermoplastic polymer particles in the coating is at least 70% by weight.

5. A method according to claim 1, wherein the hydrophobic thermoplastic polymer particles include at least 0.1% of nitrogen.

6. A method according to claim 1, wherein the coating further includes spacer particles having an average particle size between one to two times the thickness of the coating.

7. A method according to claim 6, wherein the amount of spacer particles in the coating is between 8 $mg/m^2$ and 200 $mg/m^2$.

8. A method according to claim 6, wherein the spacer particles include organic particles selected from the group consisting of polymethylmethacrylate, polyolefins, halogenated polyolefins, cross-linked polysiloxanes, or copolymers thereof.

9. A method according to claim 6, wherein the spacer particles include inorganic particles selected from the group consisting of metal oxides, metal hydroxides, zirconium containing particles, aluminiumsilicates, and metal salts.

10. A method for making a negative-working lithographic printing plate comprising the following steps:

providing a printing plate precursor obtained by the method according to claim 1;

exposing the precursor with infrared light thereby inducing coalescence of the thermoplastic polymer particles at exposed areas of the coating; and processing the exposed precursor with an aqueous solution.

11. A method for making a negative-working lithographic printing plate comprising the following steps:

providing a printing plate precursor obtained by the method according to claim 1;

exposing the precursor with infrared light thereby inducing coalescence of the thermoplastic polymer particles at exposed areas of the coating; and mounting the precursor on a printing press and developing it by supplying ink and/or fountain solution to the precursor.

* * * * *